United States Patent
Kadotani et al.

(10) Patent No.: US 9,664,985 B2
(45) Date of Patent: May 30, 2017

(54) COOLING APPARATUS AND PROJECTOR INCLUDING A COOLING FAN HOLDER HAVING MEMBERS WITH DIFFERENT NATURAL FREQUENCIES

(71) Applicant: Seiko Epson Corporation, Tokyo (JP)

(72) Inventors: Masato Kadotani, Matsumoto (JP); Norikazu Kadotani, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 81 days.

(21) Appl. No.: 14/713,320

(22) Filed: May 15, 2015

(65) Prior Publication Data

US 2015/0338726 A1    Nov. 26, 2015

(30) Foreign Application Priority Data

May 23, 2014 (JP) ................................ 2014-106812

(51) Int. Cl.
| | |
|---|---|
| *G03B 21/14* | (2006.01) |
| *G03B 21/16* | (2006.01) |
| *H05K 7/20* | (2006.01) |
| *H04N 9/31* | (2006.01) |

(52) U.S. Cl.
CPC .......... *G03B 21/16* (2013.01); *G03B 21/145* (2013.01); *H04N 9/3144* (2013.01); *H05K 7/20172* (2013.01)

(58) Field of Classification Search
CPC .... G03B 21/145; G03B 21/16; H04N 9/3144; H05K 7/20172
See application file for complete search history.

(56) References Cited

U.S. PATENT DOCUMENTS

| | | | | |
|---|---|---|---|---|
| 2002/0008852 | A1* | 1/2002 | Onishi .................. | G03B 21/16 353/57 |
| 2007/0195282 | A1* | 8/2007 | Takasuka ............... | G03B 21/16 353/61 |
| 2007/0273839 | A1* | 11/2007 | Doi ....................... | G03B 21/16 353/57 |
| 2010/0225182 | A1 | 9/2010 | Wada | |

FOREIGN PATENT DOCUMENTS

| | | |
|---|---|---|
| JP | 5-332528 A | 12/1993 |
| JP | 2008-72019 A | 3/2008 |
| JP | 2010-206984 A | 9/2010 |

\* cited by examiner

*Primary Examiner* — Sultan Chowdhury
*Assistant Examiner* — Magda Cruz
(74) *Attorney, Agent, or Firm* — ALG Intellectual Property, LLC (57) ABSTRACT

A cooling apparatus includes a cooling fan that has a rotating blade and a fan case accommodating the blade and delivers cooling air and a holder that holds the cooling fan. The holder has a first member and a second member that sandwich and support the cooling fan, and the first member and the second member are made of materials having physical properties different from each other and hence have natural frequencies different from each other.

12 Claims, 5 Drawing Sheets

COOLING APPARATUS AND PROJECTOR INCLUDING A COOLING FAN HOLDER HAVING MEMBERS WITH DIFFERENT NATURAL FREQUENCIES

BACKGROUND

1. Technical Field

The present invention relates to a cooling apparatus and a projector.

2. Related Art

There is a known projector of related art that modulates light emitted from a light source in accordance with image information and projects the modulated light on a screen or any other surface. The projector, in which a power supply that supplies optical parts, a light source, and other components arranged in the projector with electric power and other members generate heat, includes a cooling apparatus that cools the heat-generating members (see JP-A-2008-72019, for example).

The cooling apparatus described in JP-A-2008-72019 includes a centrifugal fan as a cooling fan and a fan fixing apparatus that supports and fixes the centrifugal fan. The fan fixing apparatus includes a base plate, a first press portion, a second press portion, and a duct portion.

A first attachment portion and a second attachment portion are formed on side end portions of the centrifugal fan and swell outward from the side end portions.

The first press portion has a first extending portion, and the first extending portion is formed of a first extending portion main body and a first vibration absorption member. The second press portion has a second extending portion, and the second extending portion is formed of a second extending portion main body and a second vibration absorption member.

The centrifugal fan is so supported by and fixed to the fan fixing apparatus that the first attachment portion is sandwiched between the first extending portion and the base plate and the second attachment portion is sandwiched between the second extending portion and the base plate.

The cooling apparatus is then fixed in an exterior casing via a fixing portion provided on the fan fixing apparatus.

However, in the cooling apparatus described in JP-A-2008-72019, although the centrifugal fan is supported and fixed via the first vibration absorption member and the second vibration absorption member, vibration produced when the centrifugal fan is driven is transmitted to the base plate, the duct portion, and other portions of the fan fixing apparatus, and the base plate, the duct portion, and other portions can undesirably resonate. That is, it is conceivable to configure the centrifugal fan in such away that the number of revolutions thereof is changeable in accordance with the environment in which the projector is used, drive electric power supplied from a power supply, and other factors, but the numbers of revolutions corresponding to the natural frequencies of the base plate, the duct portion, and other portions may fall within the range of the changeable numbers of revolutions. When the number of revolutions of the centrifugal fan coincides with the number of revolutions corresponding to the natural frequency of any of the base plate, the duct portion, and other portions, the corresponding one of the base plate, the duct portion, and other portions resonates, resulting in a problem of an increase in noise from the cooling apparatus.

JP-A-2008-72019 does not describe a cooling apparatus fixing structure in detail. It is, however, believed that the disclosed drawings show a structure in which a U-shaped cutout is provided in the fixing portion on the fan fixing apparatus, the cooling apparatus is pressed against the power supply (power supply unit), and a screw is inserted into the cutout and fixed to the exterior casing. That is, the cooling apparatus described in JP-A-2008-72019 has a fixing structure using the power supply, and the location where the cooling apparatus is disposed is therefore limited. The technology described in JP-A-2008-72019 therefore does not allow efficient use of a dead space in the exterior casing, possibly resulting in a problem of an increase in the size of the projector.

SUMMARY

An advantage of some aspects of the invention is to solve at least a part of the problems described above, and the invention can be implemented as the following aspects or application examples.

APPLICATION EXAMPLE 1

A cooling apparatus according to this application example includes a cooling fan that has a rotating blade and a fan case accommodating the blade and delivers cooling air and a holder that holds the cooling fan. The holder has a first member and a second member that support the cooling fan, and the first member and the second member are made of materials having physical properties different from each other and hence have natural frequencies different from each other.

According to the configuration described above, the cooling fan is held by the holder having the first member and the second member made of materials having different physical properties. The first member and the second member are so formed that they have natural frequencies different from each other. Physical properties that contribute to the natural frequency include Young's modulus and the density, and the first member and the second member are made of materials having Young's moduli and densities different from each other. Therefore, although vibration produced when the cooling fan is driven is transmitted to the first member and the second member, the region of frequencies at which the first member resonates does not overlap with the region of frequencies at which the second member resonates. The range of operable numbers of revolutions of the blades can therefore be changed with noise suppressed, that is, the cooling apparatus provided by this application example allows the amount and speed of delivered cooling air to be changed.

Further, without any change in the shapes of the first member and the second member, changing at least one of the materials of the first member and the second member allows the natural frequency of the one of the members to be changed. As a result, even when the cooling fan is driven at various numbers of revolutions that allow desired amounts of air to be supplied at desired speeds to different objects to be cooled, the objects to be cooled can be cooled with noise suppressed. The cooling apparatus provided by this application example can therefore cool a variety of objects to be cooled with noise suppressed and with no need to manufacture dies or other parts for newly forming the first member and the second member in correspondence with the different objects to be cooled.

APPLICATION EXAMPLE 2

In the cooling apparatus according to the application example described above, it is preferable that the cooling fan is so driven that the number of revolutions of the blade per unit time is changeable over a predetermined range, and that at least one of the first member and the second member is so formed that the natural frequency thereof is outside the range of frequencies corresponding to the numbers of revolutions within the predetermined range.

According to the configuration described above, since at least one of the first member and the second member is so formed that the natural frequency thereof is outside the range of the frequencies described above, the at least one of the first member and the second member does not resonate when the cooling fan is driven. Noise from the cooling apparatus can therefore be reliably suppressed.

APPLICATION EXAMPLE 3

In the cooling apparatus according to the application example described above, it is preferable that the first member and the second member are disposed along a rotation central axis around which the blade rotates with the first member disposed on the side facing one outer surface of the fan case and the second member disposed on the side facing the other outer surface of the fan case, and that the holder holds the cooling fan by causing the first member and the second member to be fixed to each other.

According to the configuration described above, the first member and the second member of the holder are disposed on opposite sides of the cooling fan, and the cooling fan is so held that it is sandwiched between the first member and the second member. The structure described above can hold the cooling fan in a well-balanced manner, and vibration of the cooling fan is transmitted equally to the first member and the second member. As a result, although the structure tends to cause the region of frequencies at which the first member resonates to overlap with the region of frequencies at which the second member resonates, the first member and the second member made of materials having physical properties different from each other reliably allow themselves to have natural frequencies different from each other. The cooling apparatus provided by this application example can therefore suppress the noise with the cooling fan held in a stable manner.

APPLICATION EXAMPLE 4

In the cooling apparatus according to the application example described above, it is preferable that the holder has a first attachment portion and a second attachment portion that allow the cooling apparatus to be fixed, and that the first attachment portion and the second attachment portion are formed on opposite sides of the rotation central axis around which the blade rotates.

According to the configuration described above, the cooling apparatus is fixed in an apparatus in which the cooling apparatus is incorporated, for example, by using screws via the first attachment portion and the second attachment portion. The cooling apparatus can thus be fixed in the apparatus without use of other devices or components in the apparatus. The cooling apparatus provided by this application example can thus be disposed in the apparatus in a highly flexible manner.

APPLICATION EXAMPLE 5

In the cooling apparatus according to the application example described above, it is preferable that the holder has a guide portion that guides the cooling air discharged from the cooling fan.

According to the configuration described above, since the holder, which holds the cooling fan, has the guide portion, the cooling air can be guided in a desired direction from a position in the vicinity of a discharge port of the cooling fan without use of other members.

APPLICATION EXAMPLE 6

In the cooling apparatus according to the application example described above, it is preferable that the cooling fan is a sirocco fan.

According to the configuration described above, since the cooling apparatus includes a sirocco fan as the cooling fan, cooling air having high discharge pressure can be delivered as compared with an axial fan. The cooling apparatus provided by this application example can therefore deliver cooling air intensively to an object to be cooled with noise suppressed.

APPLICATION EXAMPLE 7

A projector according to this application example includes alight source, a light modulator that modulates light emitted from the light source, a projection optical apparatus that projects the modulated light from the light modulator, the cooling apparatus described above, and an exterior casing that forms exterior of the projector.

According to the configuration described above, since the projector includes any of the cooling apparatus described above, an object to be cooled can be efficiently cooled with noise suppressed even when the number of revolutions of the blade is changed in accordance with the environment in which the projector is used, a low-luminance mode, a high-luminance mode, and other factors.

APPLICATION EXAMPLE 8

A projector according to this application example includes alight source, a light modulator that modulates light emitted from the light source, a projection optical apparatus that projects the modulated light from the light modulator, the cooling apparatus described above, and an exterior casing that forms exterior of the projector, in which the exterior casing has an enclosure bottom surface portion to which the cooling apparatus is attached, the fan case has an outer surface perpendicular to a direction along a rotation central axis around which the blade rotates, and the cooling apparatus is so disposed that a surface thereof that follows the outer surface intersects an inner surface of the enclosure bottom surface portion.

According to the configuration described above, the cooling fan is so disposed that a surface thereof that follows the outer surface intersects an inner surface of the enclosure bottom surface portion. That is, the cooling fan is disposed in a vertically oriented arrangement in such a way that part of a curved surface of the fan case that extends around the rotation central axis faces the inner surface of the enclosure bottom surface portion. Since a discharge port of the cooling fan can thus be located in a position separate from the enclosure bottom surface portion, cooling air having high discharge pressure, as compared with an axial fan, can be delivered from a position separate from the enclosure bottom surface portion to an object to be cooled.

Further, since the footprint of the enclosure bottom surface portion can be reduced as compared with a horizontally oriented arrangement in which the outer surface of the cooling fan faces the inner surface of the enclosure bottom surface portion, the cooling apparatus can be disposed in a dead space in the exterior casing. The projector provided by this application example can therefore be provided with the cooling apparatus with the size of the projector suppressed.

APPLICATION EXAMPLE 9

In the projector according to the application example described above, it is preferable that the cooling apparatus delivers the cooling air to the light source.

According to the configuration described above, the cooling apparatus delivers the cooling air to the light source, which is a primary heat generator in the projector. The magnitude of noise produced when the cooling fan is so driven that the amount and speed of cooling air are increased to cool the light source tends to increase. However, since the cooling apparatus is configured as described above, the noise can be efficiently suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

A projector according to an embodiment of the invention will be described below with reference to the drawings.

The projector according to the present embodiment modulates light emitted from a light source in accordance with image information and enlarges and projects the modulated light on a projection surface, such as a screen. In the following sections, the side facing the projection surface on which the projector performs projection is called a front side, and in the attitude of the projector installed on a desk or any other object, the side above the projector is called an upper side for ease of description.

Principal Configuration of Projector

Figure 1:
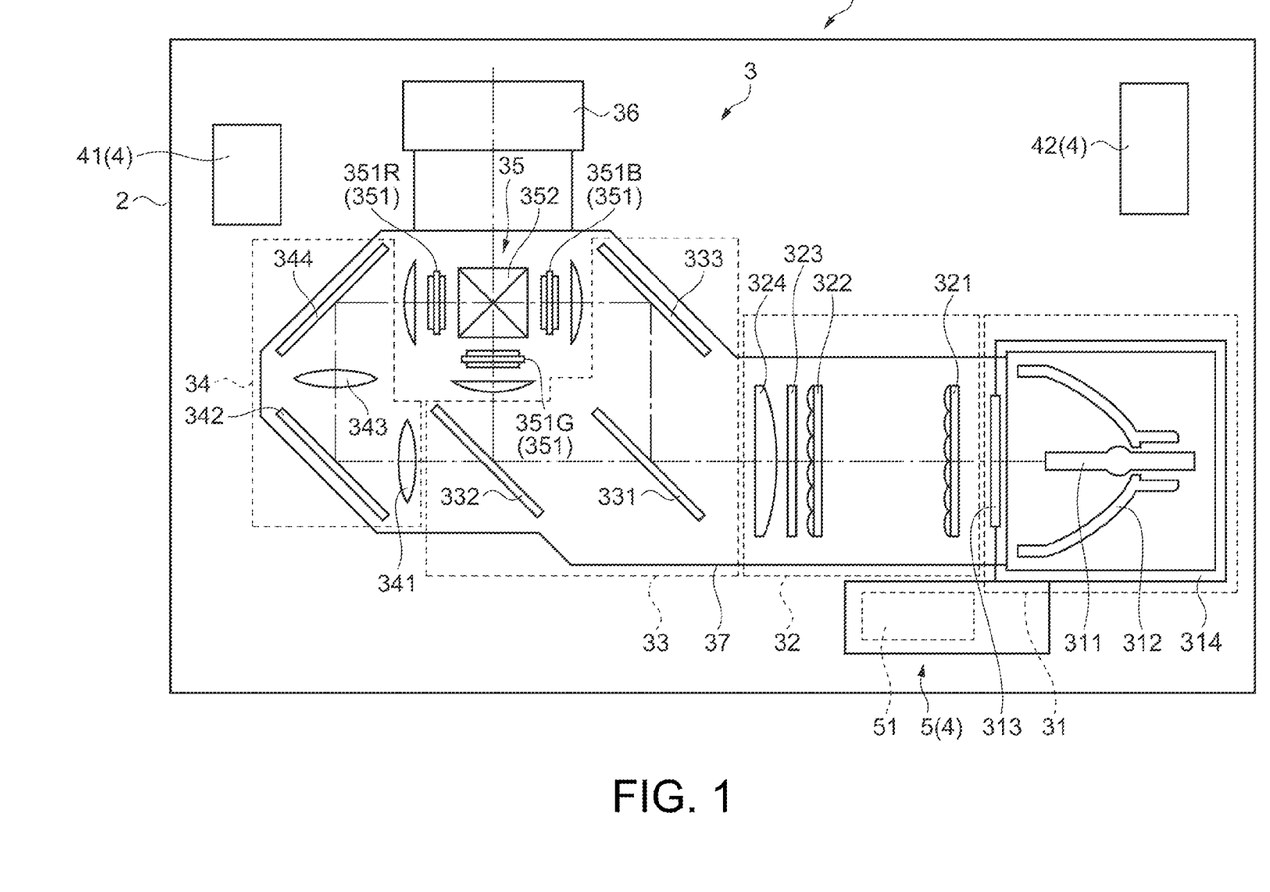
FIG. 1 is a diagrammatic view showing a schematic configuration of a projector according to an embodiment of the invention.

FIG. 1 is a diagrammatic view showing a schematic configuration of a projector 1 according to the present embodiment.

As shown in FIG. 1, the projector 1 includes an exterior casing 2, which forms the exterior of the projector 1, a controller (not shown), an optical unit 3, which includes a light source apparatus 31, and a cooling unit 4 as well as a power supply that supplies the light source apparatus 31 and other components with electric power and a temperature detector that detects the temperature in the exterior casing 2 (neither power supply nor temperature detector is shown).

The exterior casing 2, although not described in detail, is formed of a plurality of members, such as an upper case that forms an upper portion and a lower case that forms a lower portion, and provided with an air intake port through which outside air is taken in, an air exhaust port through which heated air in the exterior casing 2 is exhausted out thereof, and other portions.

The controller includes a CPU (central processing unit), a ROM (read only memory), a RAM (random access memory), and other components, functions as a computer, and controls the action of the projector 1, for example, performs control relating to image projection and drives and controls the cooling unit 4.

The optical unit 3 optically processes light outputted from the light source apparatus 31 and projects the processed light under the control of the controller.

The optical unit 3 includes, in addition to the light source apparatus 31, an optical integration illumination system 32, a color separation system 33, a relay system 34, an optical apparatus 35, the projection lens 36 as a projection optical apparatus, and an optical part enclosure 37, in which the optical parts described above are arranged in predetermined positions along the optical path, as shown in FIG. 1.

The optical unit 3 is formed in a roughly L-like shape in a plan view with the light source apparatus 31 detachably disposed at one end of the optical unit 3 and the projection lens 36 disposed at the other end of the optical unit 3, as shown in FIG. 1.

The light source apparatus 31 includes a discharge-type light source 311 formed, for example, of an ultrahigh-pressure mercury lamp or a metal halide lamp, a reflector 312, a parallelizing lens 313, and a light source enclosure 314. In the light source apparatus 31, the reflector 312 reflects light fluxes emitted from the light source 311, the parallelizing lens 313 then aligns the directions of the reflected light fluxes with each other, and the aligned light fluxes are directed toward the optical integration illumination system 32.

The optical integration illumination system 32 includes a first lens array 321, a second lens array 322, a polarization conversion element 323, and a superimposing lens 324.

The first lens array 321 has a plurality of lenslets and divides the light from the light source apparatus 31 into a plurality of sub-light fluxes. The second lens array 322 and the superimposing lens 324 collect the plurality of sub-light fluxes from the first lens array 321 and superimpose them on one another on each light modulator 351, which forms the optical apparatus 35 and will be described later. The polarization conversion element 323 includes a polarization separation film and a wave plate and aligns the directions of the randomly polarized light fluxes having exited out of the light source apparatus 31 with one another to form a polarized light flux having a predetermined polarization direction.

The color separation system 33 includes two dichroic mirrors 331 and 332 and a reflection mirror 333 and has a function of separating the light having exited out of the optical integration illumination system 32 into three color light fluxes, red light (hereinafter referred to as "R light"), green light (hereinafter referred to as "G light"), and blue light (hereinafter referred to as "B light").

The relay system 34 includes a light-incident-side lens 341, a relay lens 343, and reflection mirrors 342 and 344 and has a function of guiding the separated R light from the color separation system 33 to a light modulator 351 for R light. The optical unit 3 has a configuration in which the relay system 34 guides the R light, but the relay system 34 does not necessarily guide the R light but may instead guide the B light.

The optical apparatus 35 includes light modulators 351 provided for the respective color light fluxes (reference character 351R denotes light modulator for R light, reference character 351G denotes light modulator for G light, and reference character 351B denotes light modulator for B light) and a cross dichroic prism 352 as a light combining optical apparatus.

Each of the light modulators 351 includes a transmissive liquid crystal panel, a light-incident-side polarizer disposed on the light incident side of the liquid crystal panel, and a light-exiting-side polarizer disposed on the light exiting side of the liquid crystal panel and modulates the corresponding color light flux in accordance with image information.

The cross dichroic prism 352 is formed by bonding four rectangular prisms and therefore has a roughly square shape in a plan view, and two dielectric multilayer films are formed along the interfaces between the bonded rectangular prisms. The cross dichroic prism 352, in which the dielectric multilayer films reflect the R light and the B light modulated by the light modulators 351R and 351B and transmit the G light modulated by the light modulator 351G, combines the three color modulated light fluxes with one another.

The projection lens 36 includes a plurality of lenses and enlarges and projects the combined light from the cross dichroic prism 352 on the screen.

The cooling unit 4 includes an air intake fan 41, a duct member (not shown), an air exhaust fan 42, and a cooling apparatus 5.

The air intake fan 41 has a function of taking in outside air through an air intake port (not shown) of the exterior casing 2, and the externally taken-in air is delivered through the duct member to the light modulators 351 and other optical parts and cools these members.

The cooling apparatus 5, which includes a cooling fan 51, delivers cooling air to the light source apparatus 31 and cools the light source 311 and other components.

The air exhaust fan 42 receives air caused to flow by the air intake fan 41 and the cooling fan 51 and heated in the process of cooling the members in the projector and exhausts the heated air out of the exterior casing 2 through an air exhaust port (not shown) thereof.

Configuration of Cooling Apparatus

The cooling apparatus 5 will now be described in detail.

Figure 2A:
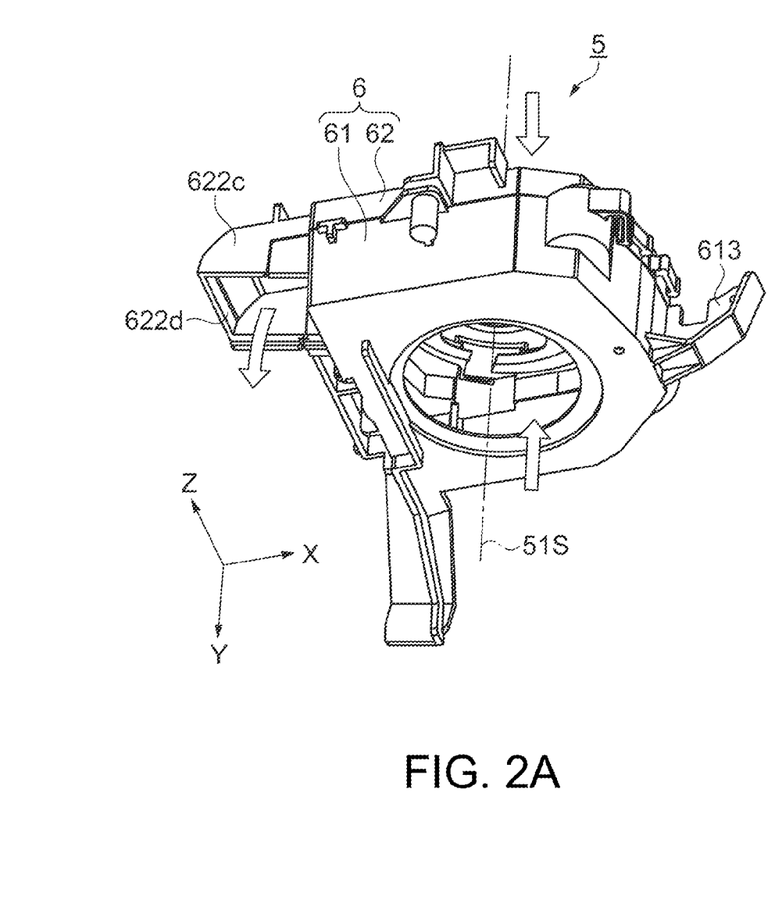
FIGS. 2A and 2B are perspective views of a cooling apparatus in the present embodiment.
Figure 2B:
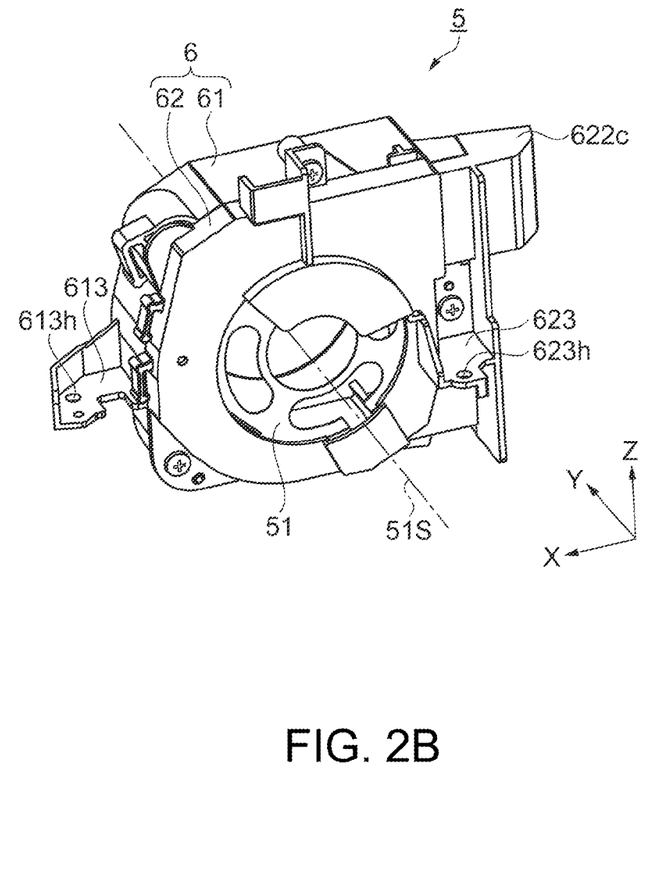
Figure 3A:
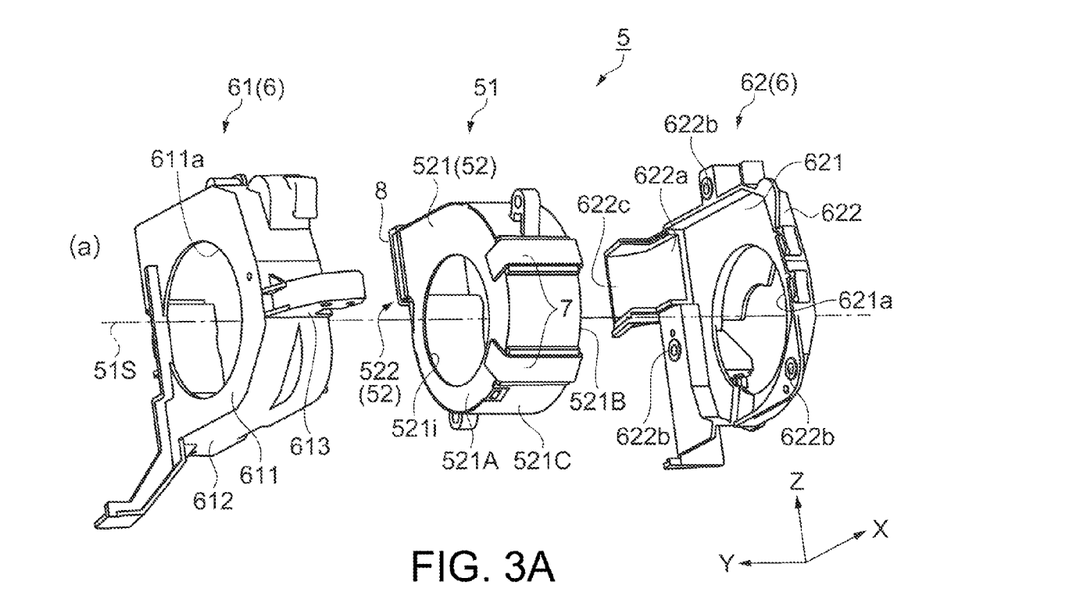
FIGS. 3A and 3B are exploded perspective views of the cooling apparatus in the present embodiment.
Figure 3B:
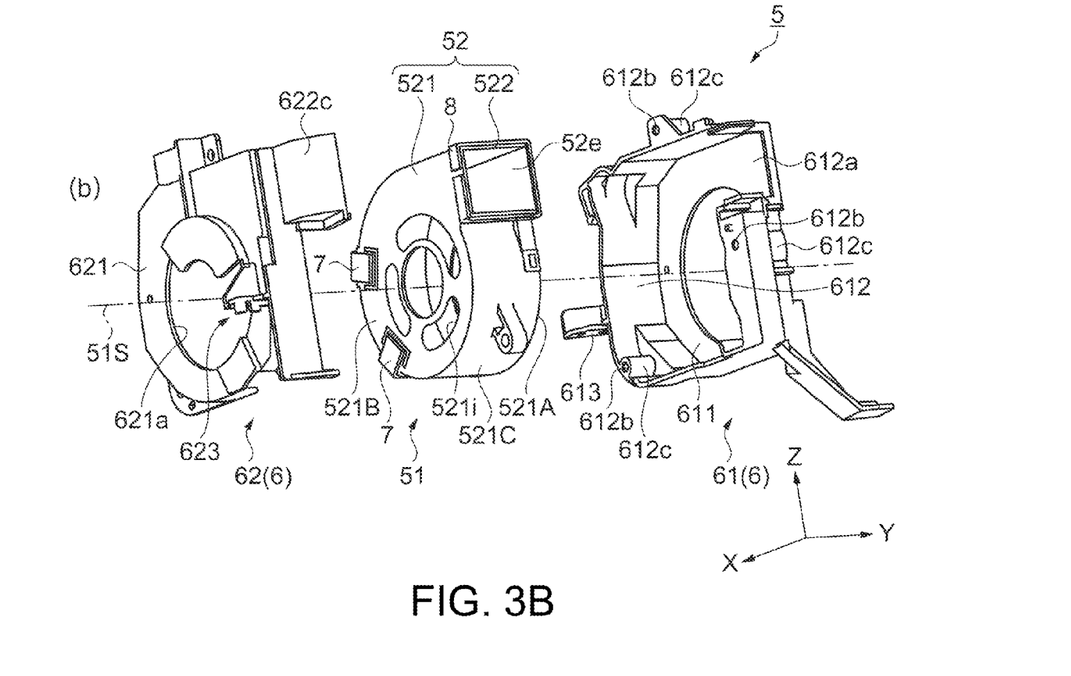

FIGS. 2A and 2B are perspective views of the cooling apparatus 5. FIG. 2A shows the cooling apparatus 5 obliquely viewed from a position in front of the projector, and FIG. 2B shows the cooling apparatus 5 obliquely viewed from a position behind the projector. FIGS. 3A and 3B are exploded perspective views of the cooling apparatus 5. FIG. 3A shows the exploded cooling apparatus 5 obliquely viewed from a position in front of the projector, and FIG. 3B shows the exploded cooling apparatus 5 obliquely viewed from a position behind the projector.

The cooling apparatus 5 includes, in addition to the cooling fan 51, a holder 6 and, cushion members 7 and 8, as shown in FIGS. 2A and 2B and FIGS. 3A and 3B.

The cooling fan 51 is formed of a sirocco fan that has rotating blades (not shown) and a fan case 52, which accommodates the blades, takes in cooling air along the direction of a rotation central axis 51S, around which the blades rotate, and discharges the cooling air in the rotation tangential direction, as shown in FIGS. 3A and 3B.

The fan case 52 has a cylindrical body portion 521, which covers the region where the blades rotate, and a discharge port forming portion 522, which protrudes from the body portion 521 and is provided with a discharge port 52e, through which air is discharged.

The body portion 521 has a first outer surface 521A and a second outer surface 521B, which are perpendicular to the direction along the rotation central axis 51S, and a curved surface 521C, which connects with the first outer surface 521A and the second outer surface 521B. Each of the first outer surface 521A and the second outer surface 521B is provided with an air intake port 521i, through which air is taken in. That is, the cooling fan 51 is a double-sided air intake sirocco fan.

The discharge port forming portion 522 is formed in a rectangular shape in a plan view, as shown in FIG. 3B.

The holder 6 has a function of holding the cooling fan 51 and a function of guiding the cooling air discharged from the cooling fan 51 to the light source apparatus 31.

The holder 6 includes a first member 61 and a second member 62, which are disposed along the rotation central axis 51S, specifically, the first member 61 is disposed on one outer surface side of the fan case 52 (the side facing the first outer surface 521A), and the second member 62 is disposed on the other outer surface side of the fan case 52 (the side facing the second outer surface 521B), and the holder 6 is configured to accommodate the cooling fan 51, as shown in FIGS. 3A and 3B. In the following sections, directions are defined with respect to the direction along the rotation central axis 51S as follows, as shown in FIGS. 2A and 2B, for ease of description: The direction oriented toward the side where the first member 61 is disposed is a +Y direction; the upward direction in the attitude of the projector 1 installed on a desk or any other object is a +Z direction; and the direction perpendicular to the +Y direction and the +Z direction and oriented rightward in FIG. 2A is a +X direction.

The first member 61 and the second member 62 are made of materials having physical properties different from each other and hence have natural frequencies different from each other.

The first member 61 has a bottom surface portion 611, which has an inner surface facing the first outer surface 521A of the cooling fan 51, and a standing portion 612, which stands from the edge of the bottom surface portion 611, as shown in FIGS. 3A and 3B.

The bottom surface portion 611 has an opening 611a formed in a position corresponding to the air intake port 521i of the cooling fan 51. The standing portion 612 is provided with a cutout 612a, in which the discharge port forming portion 522 of the cooling fan 51 is disposed, and a plurality of protrusions 612c, each of which has a threaded hole 612b formed therein, as shown in FIG. 3B. The cushion member 8 is bonded to the outer circumferential edge of the discharge port forming portion 522 of the cooling fan 51. The cutout 612a is a portion in which the discharge port forming portion 522 to which the cushion member 8 is bonded is disposed and has a function of locking the cooling fan 51 in the rotating direction around the rotation central axis 51S.

The first member 61 has a first attachment portion 613 so formed that it protrudes from the standing portion 612, as shown in FIGS. 2A and 2B and FIGS. 3A and 3B. The first attachment portion 613 is formed in a plate-like shape along an X-Y plane on the side opposite to the side where the cutout 612a of the standing portion 612 is formed, as shown in FIG. 3B. The first attachment portion 613 has a circular hole 613h so formed that it passes through the first attachment portion 613 in the Z direction, as shown in FIG. 2B.

The second member 62 is so formed that it is fit to the first member 61 and has a bottom surface portion 621, which has an inner surface facing the second outer surface 521B of the cooling fan 51, and a standing portion 622, which stands from the edge of the bottom surface portion 621 and extends along the standing portion 612.

The bottom surface portion 621 has an opening 621a formed in a position corresponding to the air intake port 521i of the cooling fan 51. The standing portion 622 is provided with a cutout 622a, in which the discharge port forming portion 522 of the cooling fan 51 is disposed, and a plurality of insertion holes 622b, into each of which a screw is inserted, as shown in FIG. 3A. The plurality of insertion holes 622b are formed in positions corresponding to the plurality of threaded holes 612b in the protrusions 612c.

The second member 62 is further provided with a guide portion 622c, which connects with the bottom surface portion 621 and the standing portion 622 in the vicinity of the cutout 622a, as shown in FIG. 3A.

The guide portion 622c is so formed that it protrudes from the first member 61 when the first member 61 and the second member 62 are combined with each other and that it has an opening 622d, which opens on the side where the first member 61 is present and in the direction along the rotation central axis 51S. That is, the cooling air discharged from the cooling fan 51 is guided along the guide portion 622c, which redirects the cooling air traveling in the rotation tangential direction, which is tangential to the rotation around the rotation central axis 51S, to travel in the direction along the rotation central axis 51S.

The second member 62 has a second attachment portion 623 so formed that it protrudes from the bottom surface portion 621, as shown in FIG. 3B. The second attachment portion 623 is formed in a plate-like shape along an X-Y plane in a position shifted toward the guide portion 622c of the bottom surface portion 621, that is, on the opposite side of the rotation central axis 51S to the first attachment portion 613, as shown in FIG. 2B. The second attachment portion 623 has a circular hole 623h so formed that it passes through the second attachment portion 623 in the Z direction, as shown in FIG. 2B.

The cushion members 7 and 8 are made, for example, of a sheet-shaped silicon material, a urethane forming material, or a rubber material and formed in an elongated shape, and an adhesive material is applied onto one surface of each of the cushion members 7 and 8.

The cushion member 7 is formed of a plurality of cushion members 7, which are bonded to the body portion 521 of the cooling fan 51 at a plurality of locations thereof, and the cushion member 8 is bonded to the outer circumferential edge of the discharge port forming portion 522, as shown in FIGS. 3A and 3B.

The cushion members 7 are bonded to the curved surface 521C and part of the first outer surface 521A and part of the second outer surface 521B on opposite sides of the curved surface 521C.

The cooling fan 51 to which the cushion members 7 and 8 are bonded is incorporated into the first member 61, and the second member 62 is fixed to the first member 61 with screws, whereby the cooling fan 51 is held by the holder 6, and an integrated cooling apparatus 5 is formed, as shown in FIGS. 2A and 2B. That is, the first member 61 and the second member 62 sandwich and support the cooling fan 51 via the cushion members 7 and 8.

Figure 4:
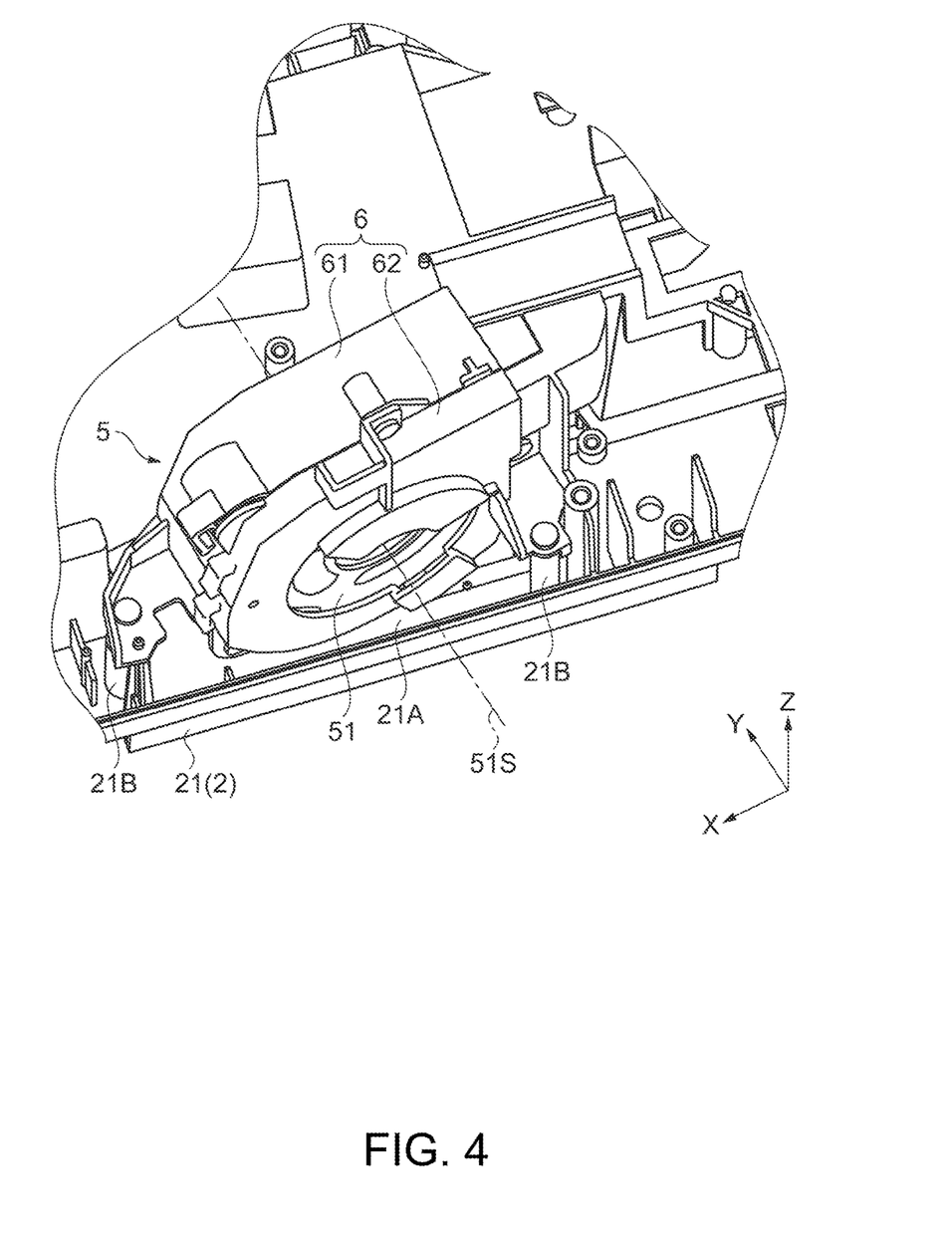
FIG. 4 is a perspective view showing part of a lower case of an exterior casing and the cooling apparatus in the present embodiment.

FIG. 4 is a perspective view showing part of a lower case 21 of the exterior casing 2 and the cooling apparatus 5.

The cooling apparatus 5 is fixed to the lower case 21 of the exterior casing 2 with screws inserted into the circular holes 613h and 623h (see FIG. 2B) in the first attachment portion 613 and the second attachment portion 623, as shown in FIG. 4. Specifically, the lower case 21 has an enclosure bottom surface portion 21A, which faces the upper surface of a desk or any other object on which the projector 1 is installed, and two bosses 21B, which protrude upward from the enclosure bottom surface portion 21A. The cooling apparatus 5 is fixed to the lower case 21 with screws inserted into the circular holes 613h and 623h and threaded into holes provided in the bosses 21B.

The cooling fan 51 is so disposed that the discharge port 52e is positioned on the upper side and the surface extending along the first outer surface 521A (second outer surface 521B) intersects the inner surface of the enclosure bottom surface portion 21A. That is, the cooling fan 51 is so disposed in vertical orientation that part of the curved surface 521C (see FIG. 3A) of the fan case 52 faces the inner surface of the enclosure bottom surface portion 21A via the standing portions 612 and 622 of the holder 6. The cooling apparatus 5 is further so disposed that the opening 622d communicates with an opening (not shown) provided in the light source enclosure 314.

Action and Noise Characteristic of Cooling Apparatus

The cooling apparatus 5, in which the cooling fan 51 is driven based on an instruction from the controller, delivers cooling air through the opening 622d (see FIG. 2A). The cooling air delivered from the cooling apparatus 5 is introduced into the light source apparatus 31 through the opening (not shown) provided in the light source enclosure 314 and cools the light source 311 and other components.

The projector 1 according to the present embodiment is configured to be operable in a low-luminance mode in which projection is performed with power consumption suppressed and in a high-luminance mode in which a brighter image is projected. The projector 1 is further so configured that the number of revolutions of the blades of the cooling fan 51 is so changed that the light source apparatus 31 can be appropriately cooled in correspondence with the temperature in the environment in which the projector 1 is used under an instruction from the controller based on a detection result from the temperature detector. That is, the cooling fan is so driven that the number of revolutions of the blades per unit time can be changed over a predetermined range. For example, the cooling fan 51 is used over a range in which the number of revolutions ranges from about 40 to 75 rps (revolutions per second) (=2,400 to 4,500 rpm (revolutions per minute)).

In the cooling apparatus 5, the first member 61 and the second member 62 are made of materials having different physical properties, as described above.

A description will now be made of a noise characteristic of the cooling apparatus. Specifically, the relationship between the number of revolutions of the blades of the cooling fan 51 and the noise emitted from the cooling apparatus 5 will be described by comparison with a case where the first member 61 and the second member 62 are made of materials having the same physical properties. A cooling apparatus in which the first member 61 and the second member 62 are made of materials having the same physical properties is now called a cooling apparatus 100 of related art for ease of description. Further, the description will be made under the following definitions: The first member 61 and the second member 62 in the cooling apparatus 100 of related art are called a first member 61u and a second member 62u, respectively; and the first member 61 and the second member 62 made of materials having different physical properties in the present embodiment are called a first member 61a and a second member 62a, respectively.

Figure 5:
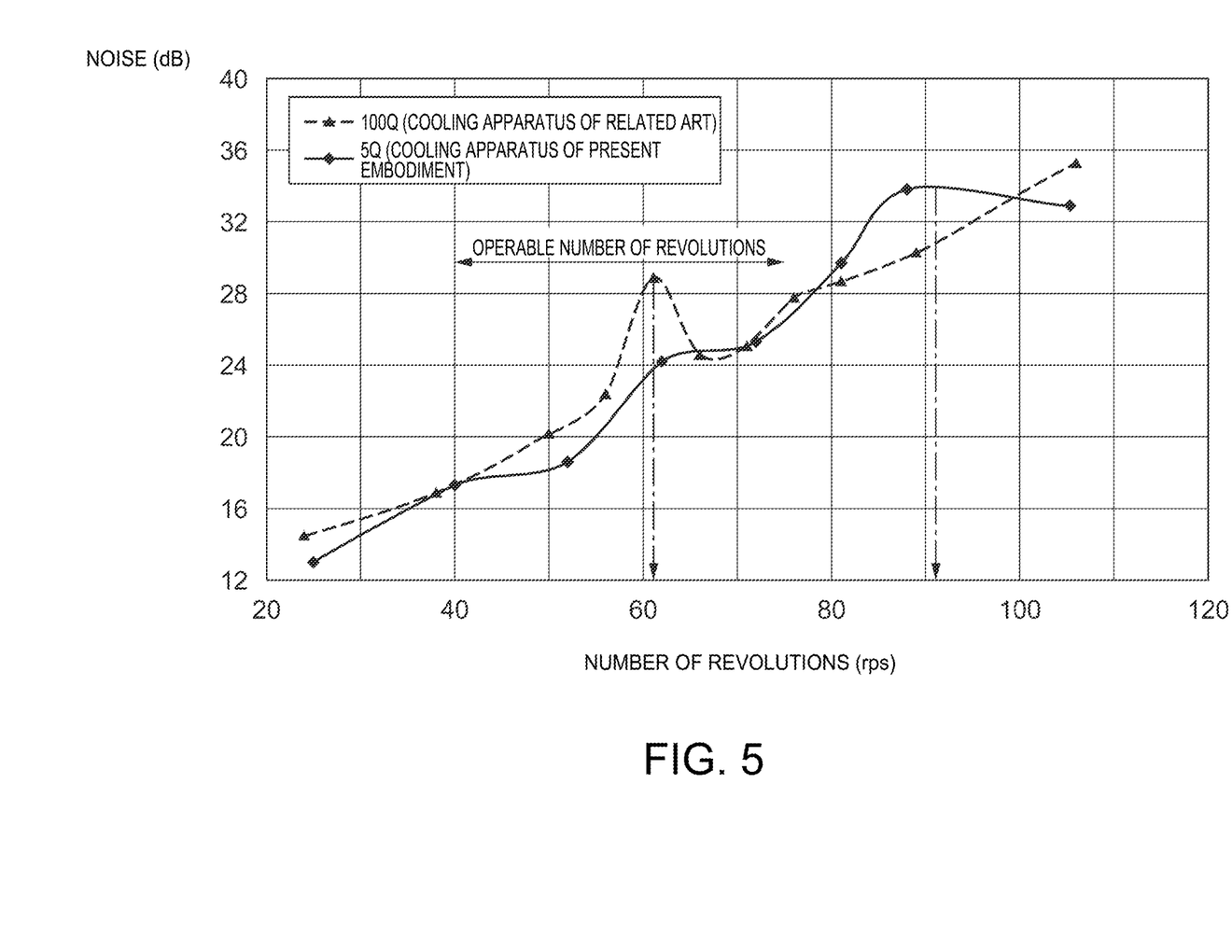
FIG. 5 shows graphs illustrating results of measurement of the relationship between the number of revolutions of blades of a cooling fan and noise emitted from the cooling apparatus.

FIG. 5 shows graphs illustrating results of measurement of the relationship between the number of revolutions of the blades of the cooling fan 51 per second and the noise emitted from the cooling apparatus 5 and comparing the noise characteristic in the case where the cooling apparatus 100 of related art is used and the noise characteristic in the case where the cooling apparatus 5 in the present embodiment is used. Specifically, in FIG. 5, a curve 100Q (dotted line) represents the noise characteristic of the cooling apparatus 100, in which the first member 61u and the second member 62u are made of an epoxy-based resin, and a curve 5Q (solid line) represents the noise characteristic of the cooling apparatus 5, in which the first member 61a is made of the epoxy-based resin and the second member 62a is made of a polycarbonate resin containing glass fibers. It is noted that the number of revolutions of the blades of the cooling fan 51 per second also represents the frequency of the rotation of the blades.

When the cooling apparatus 100 of related art is used, the magnitude of noise steeply increases at about 60 rps (=3,600 rpm), as indicated by the curve 100Q in FIG. 5. The value of about 60 rps falls within the range of operable numbers of revolutions at which the cooling fan 51 is driven (about 40 to 75 rps), and the projector 1, when it projects an image, emits noise having a large magnitude in some cases.

The reason why the magnitude of noise from the cooling apparatus 100 steeply increases at the number of revolutions of about 60 rps is that the first member 61u and the second member 62u resonate at this number of revolutions (about 60 rps) and therearound. That is, the reason for the phenomenon described above is that this number of revolutions (about 60 rps=about 60 Hz) is close to the number of revolutions corresponding to the natural frequencies of the first member 61u and the second member 62u and the resonance of the two members amplifies the noise.

On the other hand, when the cooling apparatus 5 in the present embodiment is used, the magnitude of noise at about 60 rps is lower than that in the case where the cooling apparatus 100 of related art is used, but the magnitude of noise at about 90 rps (=5,400 rpm) is greater than that in the case where the cooling apparatus 100 of related art is used, as indicated by the curve 5Q in FIG. 5. The value of about 90 rps is, however, outside the range of the numbers of revolutions at which the cooling fan 51 is used.

The reason for this is that although the first member 61a, which is made of the same material as that of the first member 61u of related art, still resonates at the number of revolutions close to about 60 rps, the second member 62a, which is made of a material having physical properties different from those of the material of the first member 61a so that the natural frequency of the first member 62a differs from the natural frequency of the first member 61a, resonates at the number of revolutions different from about 60 rps (number of revolutions close to about 90 rps in the present embodiment).

The natural frequencies of the first member 61a and the second member 62a will further be described.

A natural frequency is determined by the shape of a member, the physical properties of the member, the method for supporting the member, and other factors; on the other hand, Young's modulus E and the density ρ of the member contribute to the physical properties thereof.

Considering vibration of a simple beam by way of example, a theoretical calculation formula of the natural frequency f of the beam is represented by Expression (1).

$$f=(\lambda^2/2\pi L^2)\times\sqrt{(EI/\rho A)} \quad (1)$$

where λ: constant corresponding to support structure, L: length, E: Young's modulus, I: moment of inertia of area, ρ: density, and A: cross-sectional area Since the shapes of the first member 61 and the second member 62 and a structure that supports them cannot be approximated as a simple beam, the natural frequencies of the first member 61 and the second member 62 cannot be calculated by using Expression (1). However, when the shapes and the support structure are the same, a rough ratio of the natural frequency f between members made of materials having different physical properties can be derived by specifically using Young's modulus and the density ρ.

That is, assuming that the second member 62u (epoxy-based resin) has Young's modulus Eu, the density ρu, and the natural frequency fu and the second member 62a (polycarbonate resin containing glass fibers) has Young's modulus Ea, the density ρa, and the natural frequency fa, a natural frequency ratio α of the natural frequency between the second member 62u and the second member 62a, specifically, the natural frequency ratio α of the natural frequency of the member having a higher natural frequency (second member 62a) to the natural frequency of the member having a lower natural frequency (second member 62u) is represented by Expression (2).

$$\alpha=fa/fu=(\sqrt{(Ea/\rho a)})/(\sqrt{(Eu/\rho u)}) \quad (2)$$

Specifically, since the epoxy-based resin has Young's modulus E of about 1.7 GPa and a density ρ of about 1120 kg/m$^3$, and the polycarbonate resin containing glass fibers has Young's modulus E of about 7.5 GPa and a density ρ of about 1310 kg/m$^3$, the natural frequency ratio α is about 1.8. That is, the natural frequency of the second member 62a made of the polycarbonate resin containing glass fibers can be theoretically derived to be about 1.8 times the natural frequency of the second member 62u made of the epoxy-based resin.

The result of the derivation roughly approximates to the result of the measurement shown in FIG. 5. That is, the noise of large magnitude at about 60 rps in the case where the second member 62u made of the epoxy-based resin is used can be so changed that the number of revolutions at which the magnitude of the noise increases is shifted to the number of revolutions of about 90 rps by using the second member 62a made of the polycarbonate resin containing glass fibers.

As described above, in the cooling apparatus 5, the first member 61 and the second member 62, which support the cooling fan 51, are made of materials having different physical properties, and the first member 61 and the second member 62 therefore have natural frequencies different from each other.

The present embodiment has been described with reference to the case where the first member 61 is made of the epoxy-based resin and the second member 62 is made of the polycarbonate resin containing glass fibers. Instead, the first member 61 may be made of the polycarbonate resin containing glass fibers, and the second member 62 may be made of the epoxy-based resin. That is, the materials of the first member 61 and the second member 62 may be so selected that the natural frequency of at least one of the first member 61 and the second member 62 is outside the range of the frequencies corresponding to the operable numbers of revolutions.

Further, the first member 61 and the second member 62 are not necessarily made of the materials described above and may instead be made of other materials as long as the first member 61 and the second member 62 are made of materials having different physical properties and hence have different natural frequencies. For example, the following materials can be used: polycarbonate resin containing no glass fibers; an ABS (Acrylonitrile Butadiene Styrene) resin; a PBT (PolyButylene Terephthalate) resin; polyethylene; polypropylene; polyvinyl chloride; polystyrene; polyamide; an acrylic resin; a fluorine-based resin; a silicon resin; or a copolymer, a blend or a polymer alloy primarily containing any of the materials described above. Further, one of the first member 61 and the second member 62 may be a metal, or the first member 61 and the second member 62 may be made of metals having physical properties different from each other.

As the materials of the first member 61 and the second member 62, it is desirable to select materials having physical properties that theoretically allow the natural frequency ratio α, which is derived from Expression (2) described above, to be greater than or equal to about 1.3.

Further, the first member 61 in the present embodiment is made of a material that provides a natural frequency that falls within the range of the frequencies corresponding to the operable numbers of revolutions (epoxy-based resin). The first member 61 may instead be made of a material that provides a natural frequency outside the range of the frequencies corresponding to the operable numbers of revolutions.

As described above, in the cooling apparatus 5, the first member 61 and the second member 62 are made of materials having different physical properties and so formed that the region of frequencies at which the first member 61 resonates does not overlap with the region of frequencies at which the second member 62 resonates.

As described above, the present embodiment can provide the following advantageous effects.

(1) In the cooling apparatus 5, the first member 61 and the second member 62, which hold the cooling fan 51, are made of materials having different physical properties and so formed that the region of frequencies at which the first member 61 resonates does not overlap with the region of frequencies at which the second member 62 resonates, whereby the range of the operable numbers of revolutions of the blades can be changed with the noise suppressed, that is, the cooling apparatus 5 provided by the present embodiment allows the amount and speed of delivered cooling air to be changed. The projector 1 can therefore project an image with the noise suppressed in the low-luminance and high-luminance modes.

(2) Without any change in the shapes of the first member 61 and the second member 62 or without any change in the method for attaching the cooling apparatus 5 to the lower case 21, changing at least one of the materials of the first member 61 and the second member 62 allows the natural frequency of the one of the members to be changed. As a result, even when the cooling fan 51 is driven at various numbers of revolutions that allow desired amounts of air to be supplied at desired speeds to different objects to be cooled, for example, light sources 311 driven at different values of the drive electric power, the objects to be cooled can be cooled with the noise suppressed. The cooling apparatus 5 provided by the present embodiment can therefore cool a variety of objects to be cooled with the noise suppressed and with no need to manufacture dies or other parts for newly forming the first member 61 and the second member 62 in correspondence with the different objects to be cooled.

(3) Since the second member 62 is so formed that the natural frequency thereof is outside the range of the operable numbers of revolutions (frequencies), the noise from the cooling apparatus 5 can be reliably suppressed.

(4) The first member 61 and the second member 62 are disposed on opposite sides of the cooling fan 51 and sandwich and support the cooling fan 51. The structure described above can hold the cooling fan 51 in a well-balanced manner, and vibration of the cooling fan 51 is transmitted equally to the first member 61 and the second member 62. As a result, although the structure tends to cause the region of frequencies at which the first member 61 resonates to overlap with the region of frequencies at which the second member 62 resonates, the first member 61 and the second member 62 made of materials having physical properties different from each other reliably allow themselves to have natural frequencies different from each other. The cooling apparatus 5 provided by the present embodiment can therefore suppress the noise with the cooling fan 51 held in a stable manner.

(5) The cooling apparatus 5 is fixed to the lower case 21 with screws via using the first attachment portion 613 and the second attachment portion 623. The cooling apparatus 5 can thus be fixed in the projector 1 without use of other devices or components in the projector 1. The cooling apparatus 5 provided by the present embodiment can thus be disposed in the projector 1 in a highly flexible manner.

(6) Since the cooling apparatus 5 includes a sirocco fan as the cooling fan 51, cooling air having high discharge pressure can be delivered as compared with an axial fan. As a result, the cooling air can be intensively delivered to the light source apparatus 31, which is an object to be cooled, with the noise suppressed, whereby the light source apparatus 31 can be efficiently cooled.

(7) Since the holder 6, which holds the cooling fan 51, has the guide portion 622c, the cooling air can be efficiently guided to the light source apparatus 31 from a position in the vicinity of the discharge port 52e of the cooling fan 51 without use of other members.

(8) The cooling fan 51 is disposed in a vertically orientated arrangement with the discharge port 52e located on the upper side. Since the discharge port 52e of the cooling fan 51 can thus be located in a position separate from the enclosure bottom surface portion 21A, cooling air having high discharge pressure, as compared with an axial fan, can be efficiently introduced from a position above the light source apparatus 31.

Further, since the footprint of the enclosure bottom surface portion 21A can be reduced as compared with a horizontally oriented arrangement in which the first outer surface 521A (second outer surface 521B) of the cooling fan 51 faces the inner surface of the enclosure bottom surface portion 21A, the cooling apparatus 5 can be disposed in a dead space in the exterior casing 2. The projector 1 provided by the present embodiment can therefore be provided with the cooling apparatus 5 with the size of the projector suppressed.

(9) The cooling apparatus 5 delivers cooling air to the light source 311, which is a primary heat generator in the projector 1. The magnitude of noise produced when the cooling fan 51 is so driven that the amount and speed of cooling air are increased to cool the light source 311 tends to increase. However, since the cooling apparatus 5 is configured as described above, the noise can be efficiently suppressed.

Variations

The embodiment described above may be changed as follows.

The holder is configured to hold the cooling fan 51 with the two members, the first member 61 and the second member 62, and the holder may instead be configured to hold the cooling fan 51 with three or more members. Among the three or more members, at least two members only need to be made of materials having physical properties different from each other and hence have natural frequencies different from each other.

The cooling fan 51 in the embodiment described above is a double-sided air intake sirocco fan. The cooling fan 51 is not limited thereto and may instead be a single-sided air intake sirocco fan or may even be an axial fan.

Further, a fan other than the cooling fan 51, which cools the light source apparatus 31, for example, the air exhaust fan 42 may be configured to be held with a plurality of members, as in the case of the cooling fan 51, and among the plurality of members, at least two members may be made of materials having physical properties different from each other and hence have natural frequencies different from each other.

The cooling apparatus 5 in the embodiment described above is configured to include the first attachment portion 613 and the second attachment portion 623 and configured to be fixed to the lower case 21 via the two attachment portions, and the cooling apparatus 5 may instead be configured to include three or more attachment portions.

The projector 1 according to the embodiment described above uses a transmissive liquid crystal panel as each of the light modulators and may instead use a reflective liquid crystal panel. Still instead, a micromirror-type light modulator, such as a DMD (digital micromirror device), may be used as each of the modulators.

The light modulators in the embodiment described above employ what is called a three-panel method using three light modulators corresponding to the R light, the G light, and the B light but do not necessarily employ the three-panel method and may instead employ a single-panel method. The invention is even applicable to a projector including two light modulators or four or more light modulators.

The light source apparatus 31 does not necessarily use the discharge-type light source 311 and may instead be formed of a light source based on a different method, a light emitting diode, a laser, or any other solid-state light source.

CROSS REFERENCE TO RELATED APPLICATIONS

This application claims priority to Japanese Patent Application No. 2014-106812 filed on May 23, 2014, the entire contents of which are incorporated by reference herein.

What is claimed is:

1. A cooling apparatus comprising:
a cooling fan that has a rotating blade and a fan case accommodating the rotating blade and delivers cooling air; and
a holder that holds the cooling fan,
wherein
the holder has a first member and a second member that support the cooling fan,
the first member and the second member are made of materials having physical properties different from each other and hence have natural frequencies different from each other,
The cooling fan is so driven that a number of revolutions of the rotating blade per unit time is changeable over a predetermined range, and
at least one of the first member and the second member is so formed that the natural frequency thereof is outside a range of frequencies corresponding to the numbers of revolutions within the predetermined range.

2. The cooling apparatus according to claim 1,
wherein the first member and the second member are disposed along a rotation central axis around which the rotating blade rotates with the first member disposed on a side facing one outer surface of the fan case and the second member disposed on a side facing another outer surface of the fan case, and
the holder holds the cooling fan by causing the first member and the second member to be fixed to each other.

3. A projector comprising:
a light source;
a light modulator that modulates light emitted from the light source;
a projection optical apparatus that projects the modulated light from the light modulator;
the cooling apparatus according to claim 2; and
an exterior casing that forms an exterior of the projector.

4. The cooling apparatus according to claim 1,
wherein the holder has a first attachment portion and a second attachment portion that allow the cooling apparatus to be fixed, and
the first attachment portion and the second attachment portion are formed on opposite sides of the rotation central axis around which the rotating blade rotates.

5. A projector comprising:
a light source;
a light modulator that modulates light emitted from the light source;
a projection optical apparatus that projects the modulated light from the light modulator;
the cooling apparatus according to claim 4; and
an exterior casing that forms an exterior of the projector.

6. The cooling apparatus according to claim 1,
wherein the holder has a guide portion that guides the cooling air discharged from the cooling fan.

7. A projector comprising:
a light source;
a light modulator that modulates light emitted from the light source;
a projection optical apparatus that projects the modulated light from the light modulator;
the cooling apparatus according to claim 6; and
an exterior casing that forms an exterior of the projector.

8. The cooling apparatus according to claim 1,
wherein the cooling fan is a sirocco fan.

9. A projector comprising:
a light source;
a light modulator that modulates light emitted from the light source;
a projection optical apparatus that projects the modulated light from the light modulator;
the cooling apparatus according to claim 8; and
an exterior casing that forms an exterior of the projector,
wherein the exterior casing has a casing bottom surface portion to which the cooling apparatus is attached,
the fan case has an outer surface perpendicular to a direction along a rotation central axis around which the rotating blade rotates, and
the cooling apparatus is so disposed that a surface thereof that follows the outer surface intersects an inner surface of the casing bottom surface portion.

10. The projector according to claim 9,
wherein the cooling apparatus delivers the cooling air to the light source.

11. A projector comprising:
a light source;
a light modulator that modulates light emitted from the light source;
a projection optical apparatus that projects the modulated light from the light modulator;
the cooling apparatus according to claim 1; and
an exterior casing that forms an exterior of the projector.

12. The projector according to claim 11,
wherein the cooling apparatus delivers the cooling air to the light source.

* * * * *